United States Patent [19]

Iversen

[11] Patent Number: 4,984,066

[45] Date of Patent: Jan. 8, 1991

[54] COOLING OF LARGE SEMI-CONDUCTOR DEVICES

[75] Inventor: Arthur H. Iversen, Saratoga, Calif.

[73] Assignee: Coriolis Corporation, Saratoga, Calif.

[21] Appl. No.: 448,873

[22] Filed: Dec. 12, 1989

[51] Int. Cl.⁵ .................. H01L 23/34; H01L 23/36; H01L 23/46

[52] U.S. Cl. .......................... 357/82; 357/81

[58] Field of Search .................... 357/82, 81; 361/386; 165/80.4, 80.5

[56] References Cited

U.S. PATENT DOCUMENTS

| | | | |
|---|---|---|---|
| 2,501,331 | 3/1950 | Hein | 175/366 |
| 3,573,569 | 4/1971 | Davis et al. | 317/234 |
| 3,771,027 | 11/1973 | Marek | 357/82 |
| 3,800,190 | 3/1974 | Marek | 357/82 |
| 3,993,123 | 11/1976 | Chu et al. | 165/80 |
| 4,712,609 | 12/1987 | Iversen | 164/80.4 |
| 4,771,366 | 9/1988 | Blake et al. | 357/81 |
| 4,867,235 | 9/1989 | Grapes et al. | 357/81 |
| 4,873,613 | 10/1989 | Iversen | 357/82 |

FOREIGN PATENT DOCUMENTS 62-217647 9/1987 Japan ........................ 357/82
GB2033668 5/1980 United Kingdom .

OTHER PUBLICATIONS

"Liquid Jet Cooling of Integrated Circuit Chips"—Sachar—IBM Technical Disclosure Bulletin, vol. 20, No. 9, Feb. 1978, pp. 3727-3728.

Primary Examiner—Rolf Hille
Assistant Examiner—S. V. Clark
Attorney, Agent, or Firm—Foley & Lardner

[57] ABSTRACT

There is disclosed a wafer scale semi-conductor module stack comprising at least one wafer scale semi-conductor device mounted on each of the two surfaces of an electrical interconnect substrate, said devices having their active devices facing said substrate with means being provided whereby said substrate and said devices are electrically and mechanically attached, the opposing surfaces of said devices being the heat exchange surfaces wherein heat is removed by flowing two-phase cooling, and there being multiple substrates positioned parallel to each other and sharing a common axis, each substrate being spaced apart such as to provide a conduit between opposing devices for the flow of coolant and said conduits being fed by an input conduit with coolant discharge through an output conduit, said substrates being attached to common support posts.

20 Claims, 7 Drawing Sheets

COOLING OF LARGE SEMI-CONDUCTOR DEVICES

TECHNICAL FIELD

The present invention relates to boiling heat transfer and particularly concerns means for the efficient cooling of large semi-conductor devices in a compact package.

BACKGROUND OF THE INVENTION

The need for more efficient heat removal from semiconductor devices has become more important as design rules for IC's shrink and power levels of devices increase. The need exists for semi-conductor heat removal structures that can handle higher heat fluxes, are more compact and less costly.

SUMMARY OF THE INVENTION

The present invention provides for the efficient cooling of large semi-conductor devices.

The present invention provides for the efficient cooling of one or more large semi-conductor devices mounted on an interconnect substrate.

The present invention provides for the efficient cooling of one or more large semi-conductor devices mounted on an interconnect substrate and which are sealed in a liquid tight enclosure.

The present invention provides for the efficient cooling of one or more large semi-conductor devices mounted on an interconnect substrate and which are sealed in a liquid tight enclosure that is removable and may readily be replaced The present invention provides for the compact packaging in a sealed enclosure of multiple semi-conductor devices.

DESCRIPTION OF THE PREFERRED EMBODIMENT

Figure 1:
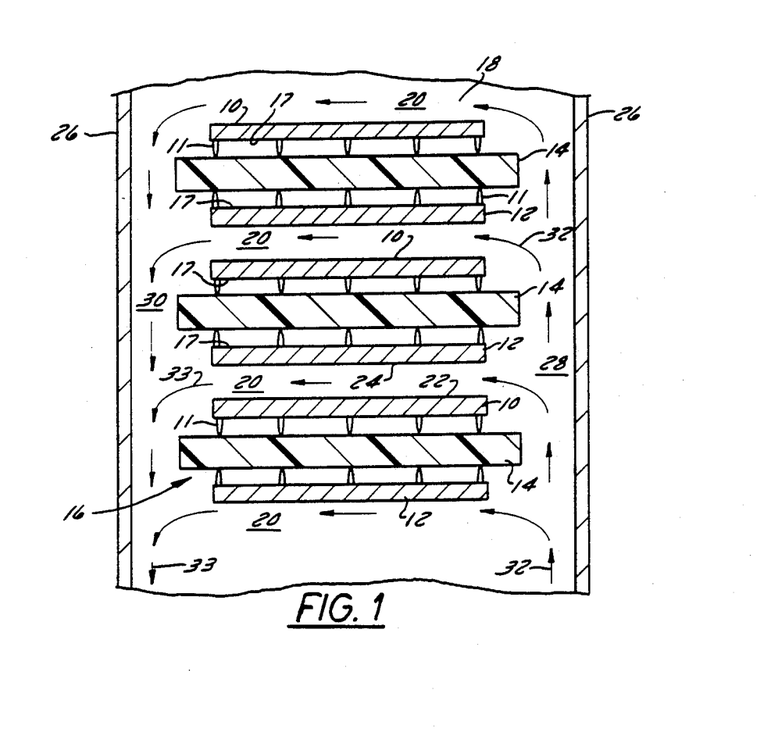
FIG. 1 is a partial cross section view of a stack of semi-conductor wafer modules with linear surface wafers illustrating the path of coolant flow over the wafers.

Referring now to FIG. 1, large or wafer scale semiconductor devices, e.g. Integrated Circuits (IC's) 10 and 12 are mounted on electrical interconnect substrate 14. Wafer scale or wafer is herein defined as a semi-conductor device or chip wherein the entire wafer as fabricated is the semi-conductor device. Alternatively, wafer scale or wafer is a semi-conductor chip or wafer segment substantially larger than a conventionally sized chip, e.g. a wafer sliced into four equal parts. Interconnect substrate 14 which may include but is not limited to a printed wiring board, e.g. epoxy glass, thick-film multilayer hybrid on ceramic, ceramic multilayer hybrid or thin film multilayer hybrid on various substrates, is hereinafter referred to as the wiring board or board. Semi-conductor wafers 10 and 12 are mounted on board 14 by various techniques such as flipchip or Tape Automated Bonding (TAB). Wafers 10 and 12 are joined physically and electrically to board 14 by means such as solder bumps 11 or tabs. Other surface mounting techniques may also be employed.

The surface 17 of wafers 10 and 12 containing the electrical interconnects 11 generally faces board 14 upon which the electrical interconnects are made, i.e. face down. The opposing surfaces 22 and 24 of wafer 10 and 12 is designated as the heat transfer surface. Devices 10 and 12 are mounted on board 14 with one wafer on each surface of board 14 to make module 16. Multiple modules 16 are assembled in a stack 18 and the modules are spaced apart from each other to form heat exchange coolant conduits 20 between the heat transfer surfaces 22 and 24 of devices 10 and 12 of opposing stacks. Conduit wall 26 forms coolant input conduit 28 and coolant discharge conduit 30 in cooperation with stack 18.

Input coolant 32 flows up input conduits 28 and in parallel feeds into the several heat exchange conduits 20. Upon passing over the several wafer heat exchange surfaces 22 and 24, the coolant discharge 33 merges in discharge conduit 30 and then passes out into a heat exchange loop (FIG. 8) and returns.

Figure 2:
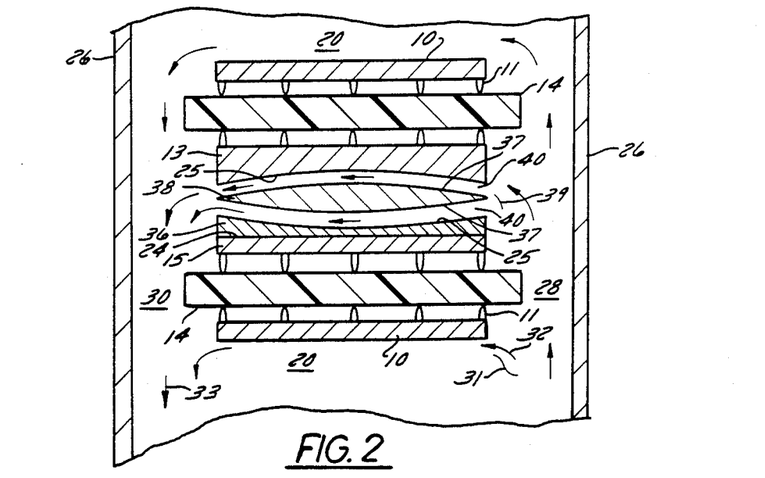
FIG. 2 is a partial cross section view of coolant flow over a stack of semi-conductor wafer modules with at least one set of opposing wafers employing curved surface cooling.

For semi-conductor elements that dissipate high heat fluxes, the more efficient technique of curved surface flow as shown in FIG. 2 may be employed. Subcooled nucleate boiling heat transfer at high heat fluxes is inherently more efficient in the context of a curved surface, where the heat flux removed $q \sim v$ where $v$ is the coolant velocity, as compared to a linear surface cooling where the heat flux removed $q \sim (v)^{\frac{1}{2}}$. In curved surface cooling the centrifugal force generated by coolant flow over concave curved heat exchange surfaces provides significant and beneficial buoyancy forces which enhance heat transfer. Curved heat exchange surface 25 of wafer 13 may, for example, be prepared mechanically by grinding or chemically by etching. Alternately, a concave curved low thermal resistance member 36, e.g. tungsten, Silicon Carbide, Aluminum Nitride, Boron Nitride etc. may be bonded to planar surface 24 of device 15. Because of the relatively large size of device 15, member 36 should have a close coefficient of expansion match to device 15 in addition to high thermal conductivity.

Convex curved 37, septum 38 forms curved coolant channels 40 in cooperation with concave curved heat exchange surfaces 25 of device 13 and member 36. In general, the cross section of conduits 20 and 40 are maintained constant to provide controlled coolant flow characteristics.

In the direction orthogonal to curved surfaces 25, 37 (FIG. 2); 44, 52 (FIG. 3), the structures are linear, i.e. if curves 25, 37 (FIG. 2) and 44, 52 (FIG. 3) are arcs of circles then the surfaces are cylindrical. This construction is further shown in FIGS. 13, 14 and 15.

Figure 3:
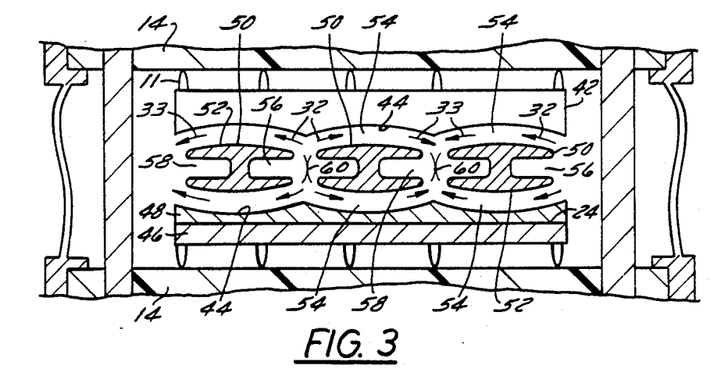
FIG. 3 is a partial cross section view of the flow paths of coolant over wafers employing periodic curved surface cooling.

Though opposing heat exchange surfaces and the corresponding septum surfaces are shown as curved, one surface may be curved and the opposing surface, both device heat exchange surface and septum may be linear, i.e. one conduit is curved and the opposing conduit linear. Flow diverters 31 may be employed to regulate the flow of coolant over low power, i.e.g CMOS, wafers 10 such that a lower velocity coolant needed for cooling is obtained. High power, e.g. bipolar, wafers 15 and 13 would be provided with the required higher velocity of coolant with flow diverters 39. In this manner, minimum volumetric coolant flow results with consequent reduction in pump power and weight and pressure drop.

For efficient cooling at higher heat fluxes and to shorten the heated path length, periodic curved surface cooling, FIG. 3, may be used. Semi-conductor wafer 42 is prepared with periodic concave curved surfaces 44 by grinding, chemical etching etc. Alternatively, opposing wafer 46 has bonded to surface 24 heat exchange member 48 prepared with periodic concave curved heat exchange surfaces 44. Member 48 is a material with high thermal conductivity and a good coefficient of expansion match to the wafer. Wafers 42 and 46 may be Silicon, Gallium Arsenide or other suitable semi-conductor material and member 48 may be Tungsten, Silicon Carbide, Silicon Nitride, Boron Nitride etc. In general, the geometry and placement of curved surfaces 44 of wafer 42 and member 48 are symmetrical.

The several septum 50 are prepared with convex curved surfaces 52 corresponding in geometry with concave curves 44 and placed such as to produce coolant conduits 54 of substantially constant cross section. The septum 50 are prepared with recesses such that adjacent recesses alternately form feeder conduits 56 for input coolant, and discharge feeder conduits 58 for output coolant.

Input coolant 32 flows down the length of feeder conduit 56 and smoothly and uniformly is caused to bifurcate and flow orthogonally into adjacent curved coolant conduits 54, by flow diverter means 60. After flowing past heat exchange surfaces 44 of wafer 42 and member 48, the discharge coolant 33 flow from adjacent conduits 54 smoothly merge again making a 90° change in direction into discharge feeder conduits 58 with the aid of flow diverters 60.

Figure 4:
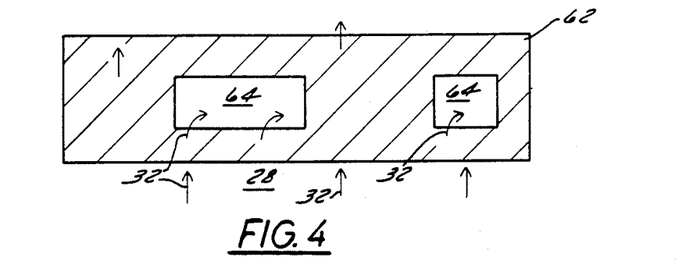
FIG. 4 illustrates a baffle plate with apertures to direct the flow of input coolant to the input feeder conduits from the input coolant conduit.
Figure 5:
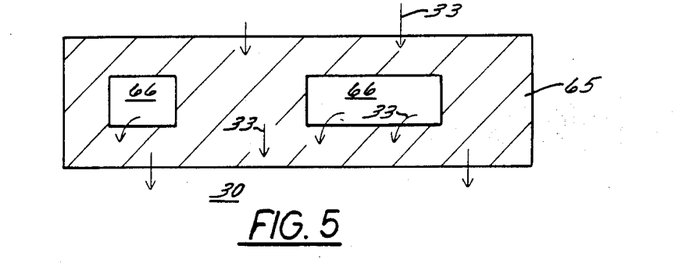
FIG. 5 illustrates a baffle plate with apertures to direct the flow of discharge coolant from the discharge feeder conduit into the discharge coolant conduit.

To direct the flow of input coolant 32 from conduit 28 into feeder conduit 56, input baffle plate 62, FIG. 4, is prepared with apertures 64 corresponding in geometry and position to input feeder conduits 56. That is, when plate 62 is mounted against the several septum 50, apertures 64 corresponds to input conduits 56. In like manner, output baffle plate 65 (FIG. 5) at the opposing end of septum 50 contains apertures 66 corresponding in geometry and position to discharge feeder conduits 58. Coolant flow 32 is up input conduit 28, then through the several baffle plate apertures 64, down input feeder conduits 56 and is thence caused by flow diverters 60 to smoothly bifurcate and turn orthogonally to uniformly flow over the heat exchange surfaces 44 in conduits 54 and thence to smoothly turn orthogonally again to merge with adjacent discharge flows in discharge feeder conduit 58. The discharge coolant 33 then flows out apertures 66 of discharge baffle plate 65 into discharge conduit 30. In general, conduit 20, 40 and 54 heights, i.e. the shortest distance between heat exchange surfaces and septum, range between 0.1 mm and 5 mm.

Figure 6:
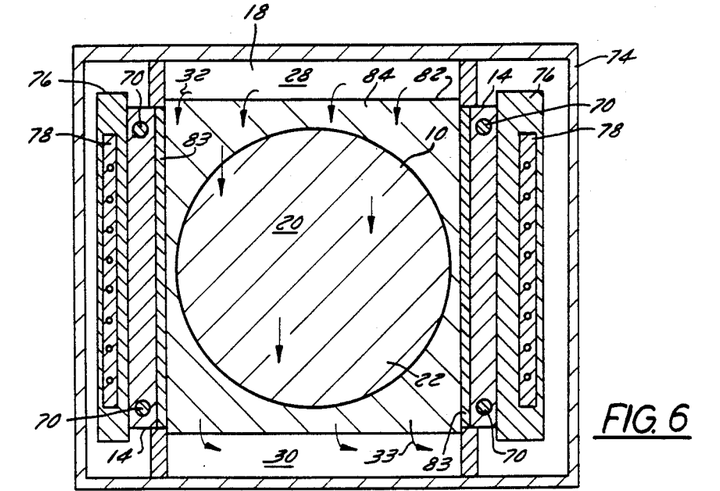
FIG. 6 is a top down view of the packaged wafer stack illustrating a wafer, interconnect board, input and discharge coolant conduits, conduit forming, electrical interconnects, combined support posts and power feeds and envelope.

FIG. 6 illustrates a top view of wafer stack 18 illustrating semi-conductor wafer 10 mounted on board 14. Posts 70 extending through all the boards 14 serve as mounting means for boards 14 and also as power leads, providing positive and negative voltages, and ground returns. Conduits 28 and 30 provide for the flow of input 32 and discharge 33 coolant. To the sides of coolant channels 28, 30, conduit 20 and conduit wall 83 are positioned electrical interconnect cables 72 extending the length of stack 18 and interconnecting 78 the several boards 14 and thence being connected to an external connector. Housing 74 is filled with coolant and encloses stack 18, conduits 28, 30 and connectors 78 and cable 72. To provide for a smooth flow of coolant through conduit 20 over wafers 10, a prefabricated, or cast in place, member 82 is placed around the circular wafer 10 such that the heat exchange surface 22 of the wafer 10 and corresponding surface 84 of the member 82 is smooth and unbroken, e.g. substantially planar for planar devices 10. Surface 84 of member 82 smoothly and continuously extends surface 22 of wafer 10 from input conduit 28 to discharge conduit 30 and across the width of conduit 20 to opposing walls 83. This minimizes undesirable flow characteristics such as cavitation, vortex shedding etc., and maintains substantially constant conduit 20 geometry from input conduit 28 to discharge conduit 30 and between conduit walls 83.

Figure 14:
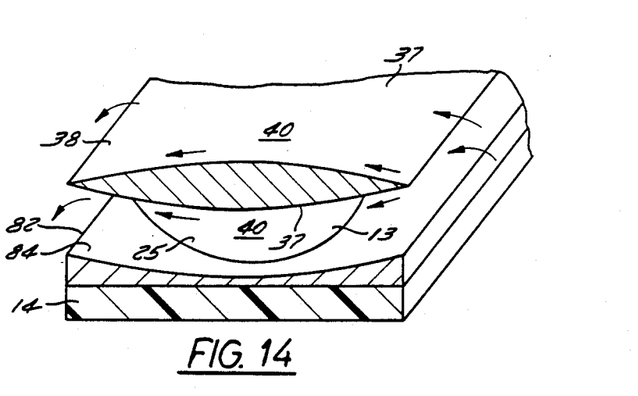
FIG. 14 is a partial cut away view of a curved surface wafer and conduit forming member to provide a continuous conduit surface.

In FIG. 14 a modified version of member 82 is employed for the curved surface cooling of FIG. 2 wherein the surface 84 of member 82 is caused to curve with the same geometry as curved heat exchange surfaces 25 of wafer 13. Curved surface 37 of septum 38 is extended over the corresponding combined curved surfaces 25 and 84 of wafer 13 and modified member 82, thereby maintaining continuity and geometry of conduits 40. Side walls 83, not shown, are also employed in conduits 40 to provide a lateral guide for the flow of coolant over wafer 13 and member 36.

Figure 15:
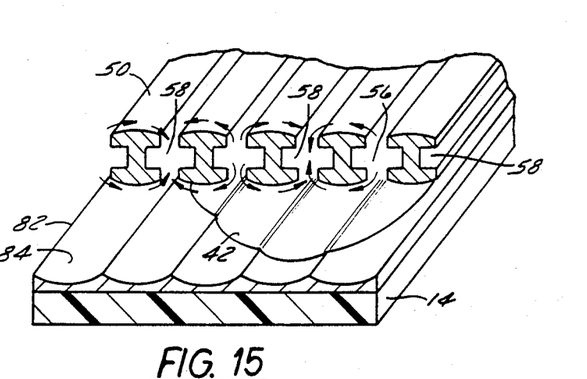
FIG. 15 is a partial cut away view of a periodic curved surface wafer and conduit forming member to provide a continuous conduit surface.

In FIG. 15 member 82 is provided with a periodic curved surface 84 that corresponds with that of wafer 42 (FIG. 3) and the septum 50 are extended to correspond to member 82 thus providing consistent conduit geometry throughout the coolant conduit. Member 82 serves to extend the generally circular wafer which occupies most of the coolant conduit (FIG. 6) and extend its heat exchange surface 22 in a continuous manner from coolant input conduit 28 to discharge conduit 30 thereby minimizing undesirable coolant flow characteristics such as cavitation, vortex shedding etc.

Figure 7:
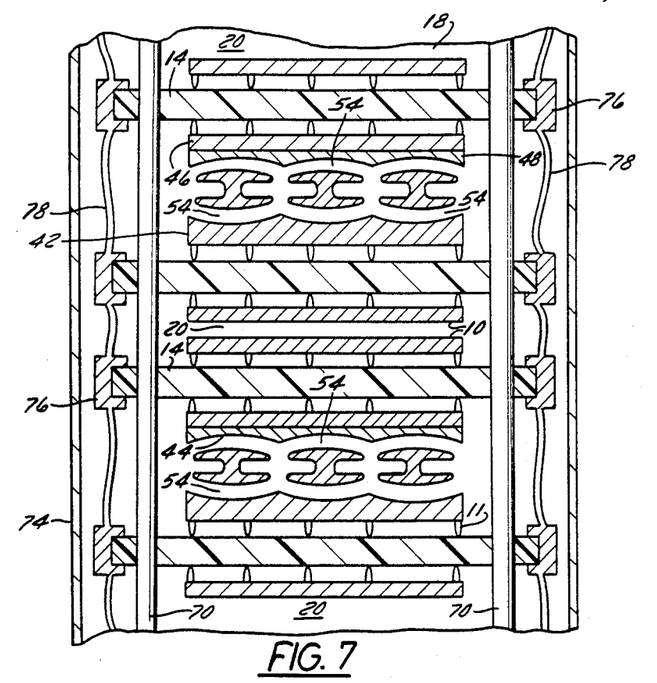
FIG. 7 is a partial cross section view of the construction of a wafer stack.

FIG. 7 illustrates a cross section view of the packaged stack 18. Wafers 10, 42, 46 are bonded by solder bump 11 or other suitable means to board 14. Boards 14 are mounted on posts 70 to provide proper spacings between the several semi-conductor wafers for conduits 20 and 54. Posts 70 also provide positive and negative voltages, and return ground leads for the several boards 14. Edge connectors 76 or other suitable electrical interconnect means and ribbon cable 78 interconnect the several boards 14, preferably at opposing ends of board 14 as shown. Other cable than ribbon 78 may be used, e.g. thin film hybrid on a flexible substrate, e.g. polyimide.

Figure 8:
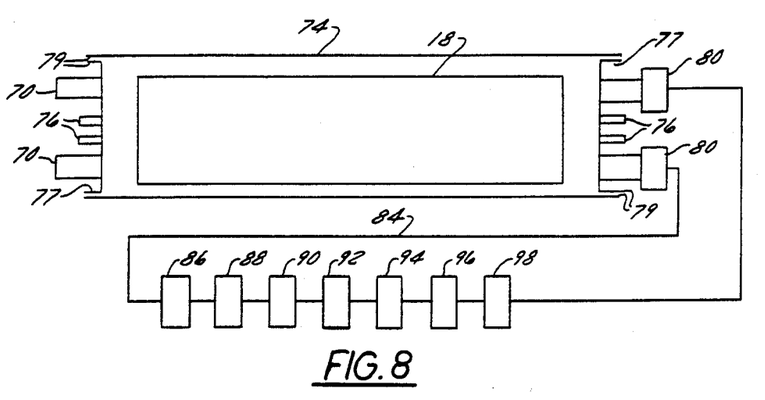
FIG. 8 is a schematic of the packaged wafer stack including coolant heat exchange loop.

As shown in FIG. 8, all components within housing 74 are immersed in coolant, e.g. fluorocarbon FC72 or FC87. Low levels of coolant flow rates over boards 14 may be provided to cool power lines in boards 14. Controlled high velocity coolant flow is generally confined to wafer cooling conduits 20, 40 and 54 and input and discharge conduits 28 and 30, FIGS. 1, 2 and 3. Fluorocarbon coolants, e.g. FC87 and FC 72, are non-corrosive, have good dielectric properties, are compatible with most materials and provide desirable low boiling points.

Figure 13:
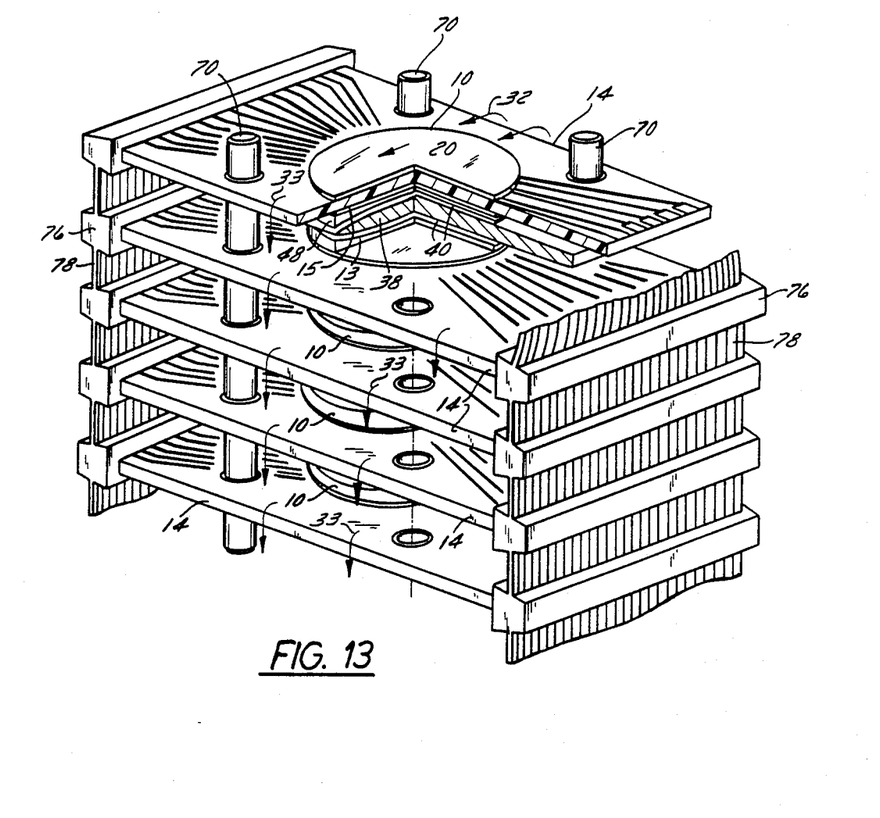
FIG. 13 is a perspective view, with partial cutaway of a module, illustrating key elements in wafer stack construction.

Referring now to FIG. 13, illustrated are key elements of a wafer stack comprising wafer 10 and wafer 15 with curved surface heat exchange member 48 mounted on opposing surfaces of board 14. Curved septum 38 is positioned substantially intermediate between member 48 and curved surface wafer 13 mounted on adjacent board 14. Conduits 40 for the flow of coolant is provided between septum 38 and curved heat exchange surfaces of member 48 and wafer 13. Posts 70 provide for mounting and positioning of boards 14 and septum 38 to provide desired conduits 20 and 40 geometries, and also serve as buss bars for voltage and current to boards 14 thus serving a dual function. Edge connectors 76 and ribbon cable 78 electrically interconnect the several boards 14. To better illustrate construction, member 82 (FIGS. 6, 14 and 15) are not shown for use in conduit 20 nor are curved surface versions of member 82 shown for adaptation to wafer 13 and member 48.

FIG. 8 illustrates a complete system comprising stack 18 contained within housing 74. Flanges 77 are mounted one at each end of stack 18 and provide for external connection of power posts 70, electrical interconnects 76 and coolant input and discharge couplers 80. Suitable coolant plumbing 84 connects coolant pump 86 to optional coolant temperature 88, pressure 90 and flow sensors 92. Bellows 94 or other expansion and coolant reservoir means and filter 95 to remove moisture, acids, particulates etc. attaches to heat exchanger 96 and then coolant flow returns to connector 80. Flanges 77 and housing 74 may be hermetically sealed by heliarc weld, brazing, adhesives or other means at their mating lips 79. When sealed and filled with coolant, all enclosed components are wetted by the fluorocarbon and protected from the environment. The fluorocarbon can maintain components within a narrow temperature range. Secondary coolant conduits, fed and discharged through conduits 28 and 30 may be established with appropriate coolant flow rates to cool posts 70, boards 14 etc.

Figure 9:
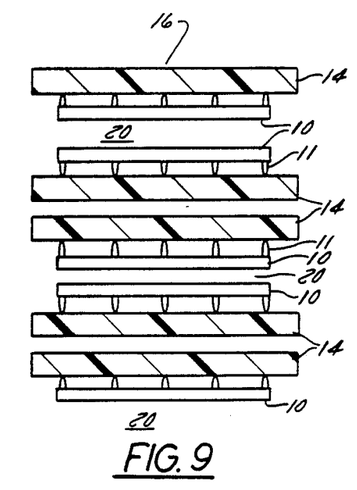
FIG. 9 is a partial cross section view of a wafer stack with one wafer on each board.

FIG. 9 illustrates a module 16 with a wafer 10 on one side only. This provides the convenience of enabling the back side of board 14 to be equipped with test points to check the wafer. In addition, it enables wiring to be added for engineering changes. Boards 14 are shown back to back with wafers 10 facing each other to form coolant conduits 20.

Figure 10:
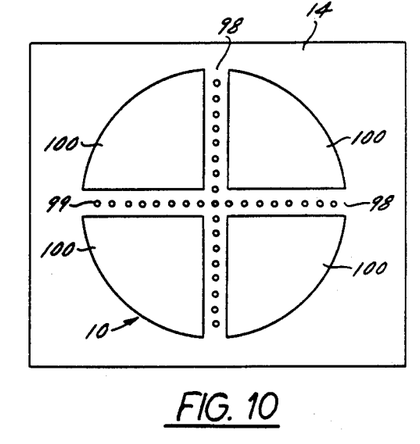
FIG. 10 is a top view of a module with a segmented wafer.

FIG. 10 illustrates wafer 10 being divided into four segments 100 with each segment separated by a small distance 98, e.g. one half centimeter on board 14. Segmenting the wafer offers several benefits, including (1) reducing expansion stress due to smaller dimensions, (2) improving yield by virtue of individual testing of separate wafer segments 100 (3) the separation between segments 100 which exposes board 14 can enable test points 99 to be established and enables engineering change wiring to be laid down. A half centimeter spacing between segments results in the effective diameter of a 10 cm (4 inch) diameter wafer increasing to 10.7 cm, a small increase in signal path length.

Semi-conductor devices employing CMOS technology are generally low power and a 4 inch wafer would dissipate about 300 W, approximately $4W/cm^2$ heat flux. Linear flow cooling as used on wafers 10 and 12 can readily handle this heat load and flux. With bipolar devices, e.g. ECL, heat dissipation in current 50,000 gate 200 ps devices has reached 60 $W/cm^2$. Thus, a 4 inch wafer would dissipate about 5KW which is a substantial heat load. In these circumstances curved surface heating could prove beneficial.

With the bipolar wafers dissipating about 5KW, current requirements are large. At 5 volts, about 1000 Amperes are needed and when multiple wafers in a stack are considered, e.g. ten of modules 16 would require 10,000 amperes. Thus current carrying posts 70 could be about several inches in diameter to carry this current load without overheating and causing an excessive voltage drop. Secondary conduits (not shown) supplied by input conduit 28 can be provided to pass coolant over posts 70. Though four posts are shown, more may be incorporated. As shown in FIGS. 2 and 3, wafer 10 can be the low power CMOS device containing about 25 Mbytes of memory, as well as about 5 CPU's and associated glue chips. Bipolar wafers 13, 15, 42 and 46 could contain about 4 million ECL gates with current technology. Thus each module 16 comprises a super computer. CMOS wafer 10 may communicate with ECL wafer 13, 15, 42 and 46 directly through board 14 though solder bumps or other interconnect means, a distance of about ½ cm thereby providing a very short signal path with consequent very high operating speeds. Center to center spacing of modules would be about 1 cm for linear flow wafers and about 2 cm for curved surface structures. A ten module stack 18 (FIGS. 2 and 3) would be about 4 inches (15 cm) high. Based on current device technology such a structure would contain about 50 CPU's and associated glue chips, 250 Mbytes of RAM and 40 million ECL gates. The wafer stack would be a 4 inch cube, about 64 $inch^3$ and would dissipate about 50KW. Such a computer could be expected to operate more than an order of magnitude faster than current super computers.

A problem encountered with heat exchange surfaces incorporating dielectric coolants, such as FC72, FC87 and R113, in boiling heat transfer is that of temperature overshoot in that after several on-off power cycles, the nucleating cavities on the heat exchange surface are flooded with coolant, the non-condensable gases normally present in said cavities having been substantially displaced by the low surface tension, low contact angle dielectric liquids. Nucleate boiling heat exchange surfaces using fluorocarbon liquids are especially prone to temperature overshoot. Upon establishment of steady nucleate boiling, the $\Delta$ T superheat returns to its normal value.

Means whereby the temperature overshoot may be reduced include reducing the initiating superheat. This may be accomplished by locally reducing the pressure directly over the reentrant nucleating cavity which in turn initiates nucleate boiling at a lower superheat. This pressure reduction may be obtained by causing the coolant streamlines to follow a curved path directly over the cavity thus taking advantage of the Bernoulli effect. Curved coolant streamlines may be induced by protrusions which are preferably part of the cavity geometry. We refer to these as effects as microcurvature effects to distinguish them from the macrocurvature of the curved heat transfer surfaces shown in FIGS. 2 and 3.

Figure 11:
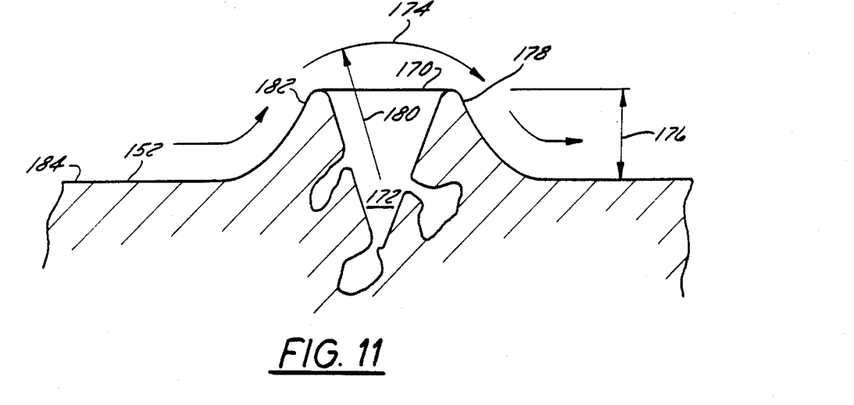
FIG. 11 is a cross section view of a nucleating site cavity that is designed to minimize temperature overshoot and improve heat transfer.

In general, the height of the protrusions ranges from about 0.1 the height of the viscous sublayer to past the transition zone into the main flow region. Referring now to FIG. 11, It is desirable to encompass cavity 172 with protrusion 178, the throat 170 of cavity 172 being exposed to coolant flow as shown in FIG. 15. The outer surface of protrusion 178 is shown as approximately concave 182 so as to promote curved streamlines 174. The distribution of reentrant nucleating site cavities 172 and protrusions 178 on heat exchange surface 152 is such so as to obtain optimum heat transfer rates. Cavity and protrusion dimensions may range from 0.001mm to 0.2mm and cavity-to-cavity spacing may range from 0.03mm to 3mm. Other geometries of protrusion 178 may prove optimum depending on coolant parameters such as velocity, density, viscosity, surface tension, temperature etc. The optimum geometry and placement of cavities, wherein at maximum heat flux the nucleate bubbles are sufficiently far apart to prevent coalescence and consequent film boiling, i.e. burn out, enables higher heat fluxes to be dissipated.

Figure 12:
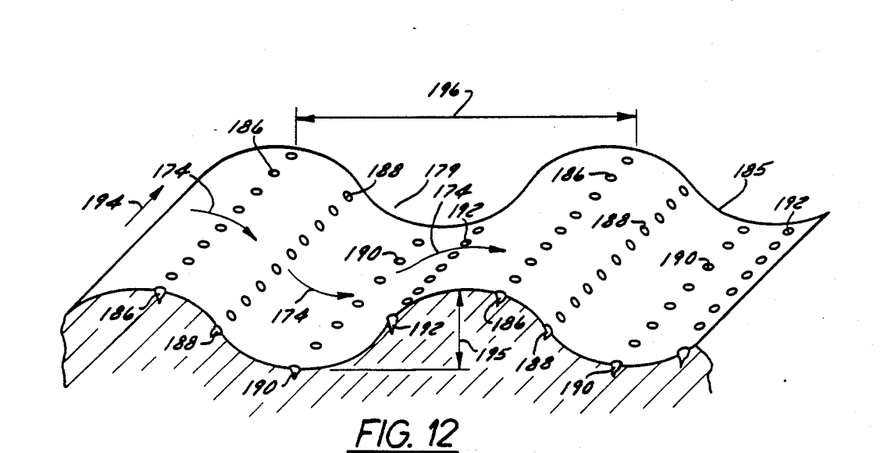
FIG. 12 is a angled view of an undulating surface of small dimensions containing nucleating site cavities designed to minimize temperature overshoot.

A further preferred embodiment to reduce the initiating superheat is shown in FIG. 12. Heat transfer surface 179, for both curved and linear surfaces, is caused to undulate 185 in the direction of coolant flow 174 with the undulations preferably projecting linearly in the direction 194 orthogonal to coolant flow 174, that is, undulations 185 are elongated in direction 194. For discussion purposes, cavity 186 is shown at the peak of the undulation, cavity 188 on the downstream slope, cavity 190 in the trough and cavity 192 on the upstream slope. In general, cavity distribution will be denser than described above. Coolant streamlines 174 are shown concave over the line of cavities 186 along the peak of undulations 185 thus lowering the pressure by the Bernoulli effect and triggering nucleate boiling. Cavities 188 on the downstream side of undulation 185 will experience a lower local pressure drop than cavities 186. Cavities 190 in the trough of undulation 185 will see a small pressure increase while cavities 192 in the upstream surface will see a pressures increase.

Nucleate boiling will commence with cavities 186 which have the lowest pressure over the cavities. The localized intense turbulence generated by the nucleate bubbles combined with the sweep of nucleate bubbles over cavities 188 will trigger nucleate boiling in cavities 188. In like manner, nucleate boiling will be triggered successively in cavities 190 and then 192. Once nucleate boiling commences with cavities 186, streamlines 174 tend to be broken up and local turbulence at the nucleating sites increasingly predominates. Under these conditions the curved streamlines 174 illustrated in FIGS. 11 and 12 are completely disrupted and the microcurvature effects no longer influence the heat transfer process. Heights 195, that is, peak-to-peak, of the undulating surface 185 may range from 0.001 mm to 0.5 mm and the period 196 of undulations 185 may range from 0.005 mm to 5 mm.

Cavities 172 and related protrusions 178 may be made by a number of methods. For minute cavities and protrusions of micron and sub-micron dimensions with high packing densities Electrical Discharge Texturing (EDT), a variant of Electrical Discharge Machining (EDM), may be used. Other methods such as chemical milling or laser drilling may be used for larger cavities and protrusions. Reactive chemicals may be added to the above processes to promote desired protrusion and reentrant cavity geometries during surface preparation.

At the throat 170 of cavity 172 in FIG. 13, the pressure in the liquid is lowered by an amount:

$$\Delta P \sim \rho v^2 h/r$$

where p is the liquid density, v is the coolant velocity 174, h the height 176 of the protrusion 178 and r the radius of microcurvature 180 of the coolant streamlines 174 passing over cavity 172. The streamlines 174 are shown as concave curved with respect to cavities 172. The geometry of the protrusions 178 are made such as to optimize the radius of curvature 180 of the streamlines 174. If the radius of curvature of the streamlines is too small as might occur with a sharp protrusion, the streamlines could break up, vortex shedding could take place etc., thus rendering the protrusions less effective. Water at a velocity of 15 meters/sec. has a viscous sublayer thickness of about $5 \times 10^{-3}$ mm and a transition zone thickness of about $25 \times 10^{-3}$ mm. Heights of the protrusions above the heat exchange surface 184 may range from about one tenth of the thickness of the viscous sublayer to about three times the combined thickness of the viscous sublayer and transition zone, i.e., 0.001 mm to 0.5 mm. Thus, temperature overshoot can be reduced by this cavity enhancement method.

I claim:

1. A wafer scale semi-conductor module stack comprising at least one wafer scale semi-conductor device mounted on each of the two surfaces of an electrical interconnect substrate, said devices having their active devices facing said substrate with means being provided whereby said substrate and said devices are electrically and mechanically attached, the opposing surface of said devices being the heat exchange surfaces wherein heat is removed by flowing two-phase cooling, and there being multiple substrates positioned parallel to each other and sharing a common axis, each substrate being spaced apart such as to provide a conduit between opposing devices for the flow of coolant and said conduits being fed by an input conduit with coolant discharge through an output conduit, said substrates being attached to common posts, said posts also serving as electrical power sources for said wafers, there further being electrical interconnect means between each of the multiple substrates, and said module stack being enclosed in a sealed housing flooded with coolant, said housing being provided with means for the input and discharge of coolant through said conduits, external power interconnection means for said posts and external electrical interconnect means for said substrate electrical interconnect means.

2. A wafer scale semi-conductor module stack comprising at least one wafer scale semi-conductor device mounted on each of the two surfaces of an electrical interconnect substrate, said devices having their active devices facing said substrate with means provided whereby said substrate and said devices are electrically and mechanically attached, the opposing surface of said devices being the heat exchange surfaces wherein heat is removed by flowing two-phase cooling, and there being multiple substrates positioned parallel to each other and sharing a common axis, each substrate being spaced apart such as to provide a conduit between opposing devices for the flow of coolant and said conduits being fed by an input conduit with coolant discharge through an output conduit, said substrates being attached to common posts, said posts also serving as electrical power sources for said wafers, there further being electrical interconnect means between each of the multiple substrates, and said module stack being enclosed in a sealed housing flooded with coolant, said housing being provided with means for the input and discharge of coolant through said conduits, external power interconnection means for said posts and external electrical interconnect means for said substrate electrical interconnect means, wherein said device heat exchange surface is concave curved in the direction of coolant flow and there being a septum with a convex curved surface corresponding to said concave surface and being spaced from said heat exchange surface to provide a coolant conduit with substantially constant cross section.

3. In the apparatus of claim 2 wherein said device heat exchange surface is periodic concave curved in the direction of coolant flow and there being a septum with a periodic convex curved surface corresponding to said concave surface and being spaced from said heat exchange surface to provide a coolant conduit with substantially constant cross section.

4. In the apparatus of claim 1 wherein means are provided whereby said coolant conduit surfaces are maintained substantially smooth and continuous to the flow of coolant throughout the length and breadth of said coolant conduits.

5. In the apparatus of claim 2 wherein an external cooling loop is connect to said housing comprising coolant pumping means and coolant heat exchanger, and optional coolant expansion and resevior means and optional coolant flow, temperature and pressure sensing means.

6. In the apparatus of claim 1 wherein said electrical interconnect means and said posts are external to said coolant conduits.

7. In the apparatus of claim 2 wherein said device curved heat exchange surface is prepared by at least one of grinding or chemical etching.

8. In the apparatus of claim 3 wherein said device periodic curved heat exchange surface is prepared by at least one of grinding or chemical etching.

9. In the apparatus of claim 2 wherein heat exchange surfaces have bonded thereto members being at least one of curved and periodically curved heat exchange surfaces and having high thermal conductivity and a good expansion match to said device are bonded to said device.

10. In apparatus of claim 9 said heat exchange members are at least one of tungsten, Silicon Carbide, Silicon Nitride and Boron Nitride.

11. In the apparatus of claim 2 wherein said heat exchange surface is provided with elevated reentrant nucleating site cavities, said elevated cavities having a height ranging from 0.001 mm to 0.5 mm above said heat exchange surface and the dimensions of said cavities ranging from 0.002 mm to 0.2 mm and said cavities being spaced apart on said heat exchange surface from 0.03 mm to 3 mm.

12. In the apparatus of claim 2 wherein said heat exchange surface is caused to undulate in the direction of coolant flow, said undulations ranging from a peak-to-peak height above the heat exchange surface from 0.001 mm to 0.5 mm and the periods of said undulations ranging from 0.005 mm to 5 mm.

13. In the apparatus of claim 1 wherein said substrate has mounted on one surface only at least one wafer scale semi-conductor device.

14. In the apparatus of claim 1 wherein said electrical interconnect and mechanical mounting means includes at least one of solder bump (flip chip) and Tape Automated Bonding.

15. The apparatus of claim 3, wherein said conduits are approximately 0.1 to 5 millimeters in height.

16. The apparatus of claim 1, wherein said wafer is divided into a first segment and a second segment.

17. An apparatus for cooling a plurality of integrated circuits, comprising:
a plurality of modules, each comprising a thin, substantially planar substrate having a semi-conductor device mechanically and electrically connected to each of respective first and second oppositely disposed surfaces thereof;
a housing having an inlet and a discharge coolant connection disposed on an external surface thereof, said housing having respective first and second internal walls defining an internal region therewithin, said housing further including means for supporting said modules in substantially parallel, spaced apart relation such that a coolant flow path is substantially defined between respective adjacent modules;
an inlet conduit, substantially defined by said first internal wall and cooperating with said inlet coolant connection, disposed to supply liquid coolant from said inlet coolant connection to each of said coolant flow paths;
a discharge conduit, substantially defined by said second internal wall and cooperating with said discharge coolant connection, disposed to receive liquid coolant from each of said coolant flow paths and direct the coolant to said discharge coolant connection;
said modules being configured such that each of said coolant flow paths are at least partially defined by at least one semi-conductor device.

18. The apparatus of claim 17, further comprising a plurality of elongated posts extending in a direction substantially orthogonal to a plane substantially defined by one of said modules, each of said modules being electrically and mechanically secured to each of said posts, said posts being configured to maintain electrical communication between two or more of said semi-conductor devices.

19. The apparatus of claim 17, wherein said semi-conductor devices comprise substantially circular wafer scale semi-conductor devices, each of said modules further comprising an extension member secured to each of said first and second surfaces of said substrate, said extension member having a circular void formed therein substantially conforming to the shape of said wafer scale semi-conductor device, such that said wafer scale semi-conductor device and said extension member cooperate to define a substantially smooth coolant flow path surface.

20. The apparatus of claim 19, wherein said coolant flow paths are approximately 0.1 to 5 millimeters in height.

* * * * *